United States Patent
Kim et al.

(10) Patent No.: US 10,741,510 B2
(45) Date of Patent: Aug. 11, 2020

(54) SEMICONDUCTOR PACKAGE

(71) Applicant: SAMSUNG ELECTRONICS CO., LTD., Suwon-si (KR)

(72) Inventors: Woon Chun Kim, Suwon-si (KR); Ji Hye Shim, Suwon-si (KR); Seung Hun Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/105,227

(22) Filed: Aug. 20, 2018

(65) Prior Publication Data

US 2019/0229078 A1   Jul. 25, 2019

(30) Foreign Application Priority Data

Jan. 19, 2018   (KR) .................. 10-2018-0007108

(51) Int. Cl.
   *H01L 23/00*   (2006.01)
   *H01L 23/31*   (2006.01)
   *H01L 23/498*  (2006.01)
   *H01L 23/16*   (2006.01)

(52) U.S. Cl.
   CPC ............ *H01L 24/02* (2013.01); *H01L 23/16* (2013.01); *H01L 23/3128* (2013.01); *H01L 23/49822* (2013.01); *H01L 23/562* (2013.01); *H01L 2224/02313* (2013.01); *H01L 2224/02331* (2013.01); *H01L 2224/02379* (2013.01); *H01L 2224/02381* (2013.01)

(58) Field of Classification Search
   CPC ............. H01L 24/02; H01L 23/3128; H01L 23/49822; H01L 2224/02313; H01L 2224/02331; H01L 2224/02379; H01L 2224/02381
   See application file for complete search history.

(56) References Cited

U.S. PATENT DOCUMENTS

| | | | |
|---|---|---|---|
| 2010/0096749 A1* | 4/2010 | Kim .................. | H01L 21/76898 257/737 |
| 2016/0336249 A1* | 11/2016 | Kang .................. | H01L 23/3128 |
| 2017/0365566 A1 | 12/2017 | Lee et al. | |

FOREIGN PATENT DOCUMENTS

| | | |
|---|---|---|
| JP | 2000-49458 A | 2/2000 |
| KR | 10-2006-0075339 A | 7/2006 |
| KR | 10-2009-0024854 A | 3/2009 |
| KR | 10-2017-0142811 A | 12/2017 |

OTHER PUBLICATIONS

Office Action issued in corresponding Korean Application No. 10-2018-0007108, dated Mar. 16, 2019.

\* cited by examiner

*Primary Examiner* — Kimberly N Rizkallah
*Assistant Examiner* — Alexander Belousov
(74) *Attorney, Agent, or Firm* — Sughrue Mion, PLLC

(57) ABSTRACT

A semiconductor package includes a semiconductor chip having an active surface having connection pads disposed thereon and an inactive surface opposing the active surface, an encapsulant encapsulating at least a portion of the semiconductor chip, and a connection member disposed on the active surface of the semiconductor chip and including a redistribution layer and a via electrically connected to the connection pads of the semiconductor chip, wherein at least a portion of the redistribution layer and the via is formed of a metal layer having a concave portion depressed from a lower surface thereof and filled with an insulating material.

15 Claims, 12 Drawing Sheets

I-I'

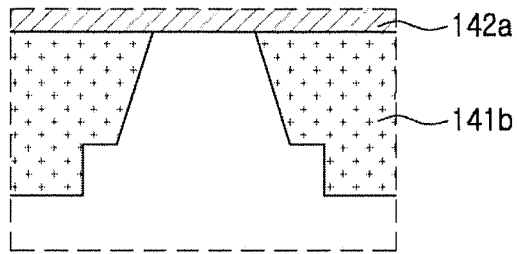
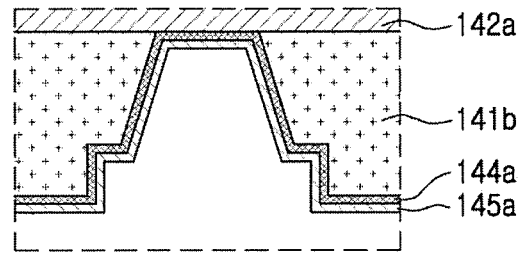
FIG. 11A　　　　　　　FIG. 11B
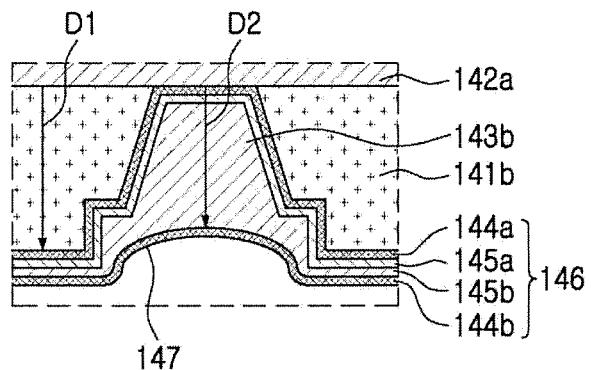
FIG. 11C
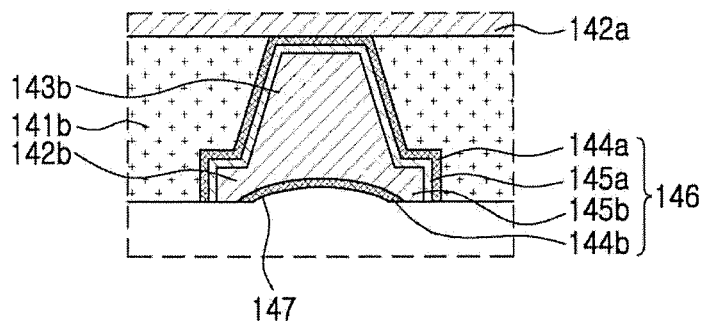
FIG. 11D

SEMICONDUCTOR PACKAGE

CROSS-REFERENCE TO RELATED APPLICATION

This application claims the benefit of priority to Korean Patent Application No. 10-2018-0007108 filed on Jan. 19, 2018 in the Korean Intellectual Property Office, the disclosure of which is incorporated herein by reference in its entirety.

TECHNICAL FIELD

The present disclosure relates to a semiconductor package.

BACKGROUND

Semiconductor packages are continuously becoming lighter, thinner, shorter, and smaller in terms of shape, and a system-in-package (SiP) package requiring complexity and versatility in terms of function is being pursued.

One type of semiconductor package technology suggested to satisfy the technical demand, described above, is a fan-out semiconductor package. Such a fan-out semiconductor package realizes a plurality of pins even with a small size by redistributing connection terminals outwardly of a region in which a semiconductor chip is disposed.

Particularly, as commercialization of 5G and IoT approaches, it is required to process explosively increasing data and communication between semiconductors and devices in a high frequency region is required. To this end, a redistribution layer and a substrate such as a main board of a semiconductor package require realization of circuits of pitches finer than existing circuits and reliable signal transmission characteristics. With such circuit miniaturization and thinning of the insulating layer constituting the redistribution layer, it is important to ensure adhesion between a wiring layer and the insulating layer in the redistribution layer of the semiconductor package.

SUMMARY

An aspect of the present disclosure may provide a semiconductor package in which adhesion between a wiring layer and an insulating layer is ensured in a connection member.

According to an aspect of the present disclosure, a dimple structure is formed in a wiring layer or a via, in a connection member for redistributing a connection pad of a semiconductor chip.

For example, a semiconductor package according to an exemplary embodiment of the present disclosure may include: a semiconductor chip having an active surface having connection pads disposed thereon and a inactive surface opposing the active surface; an encapsulant encapsulating at least a portion of the semiconductor chip; and a connection member positioned on the active surface of the semiconductor chip and including a redistribution layer and a via electrically connected to the connection pads of the semiconductor chip, wherein at least a portion of the redistribution layer and the via is configured as a metal layer having a concave portion depressed from a lower surface and filled with an insulating material.

BRIEF DESCRIPTION OF DRAWINGS

The above and other aspects, features and other advantages of the present disclosure will be more clearly understood from the following detailed description taken in conjunction with the accompanying drawings, in which:

FIGS. 11A to 11D are schematic cross-sectional views illustrating an example of a process of forming an enlarged area of FIG. 9;

DETAILED DESCRIPTION

Hereinafter, a connection member for redistributing connection pads of a semiconductor chip, in which a mutual interference is eliminated by enhancing electrical shielding between adjacent signal lines, will be described with reference to the drawings.

Electronic Device

Figure 1:
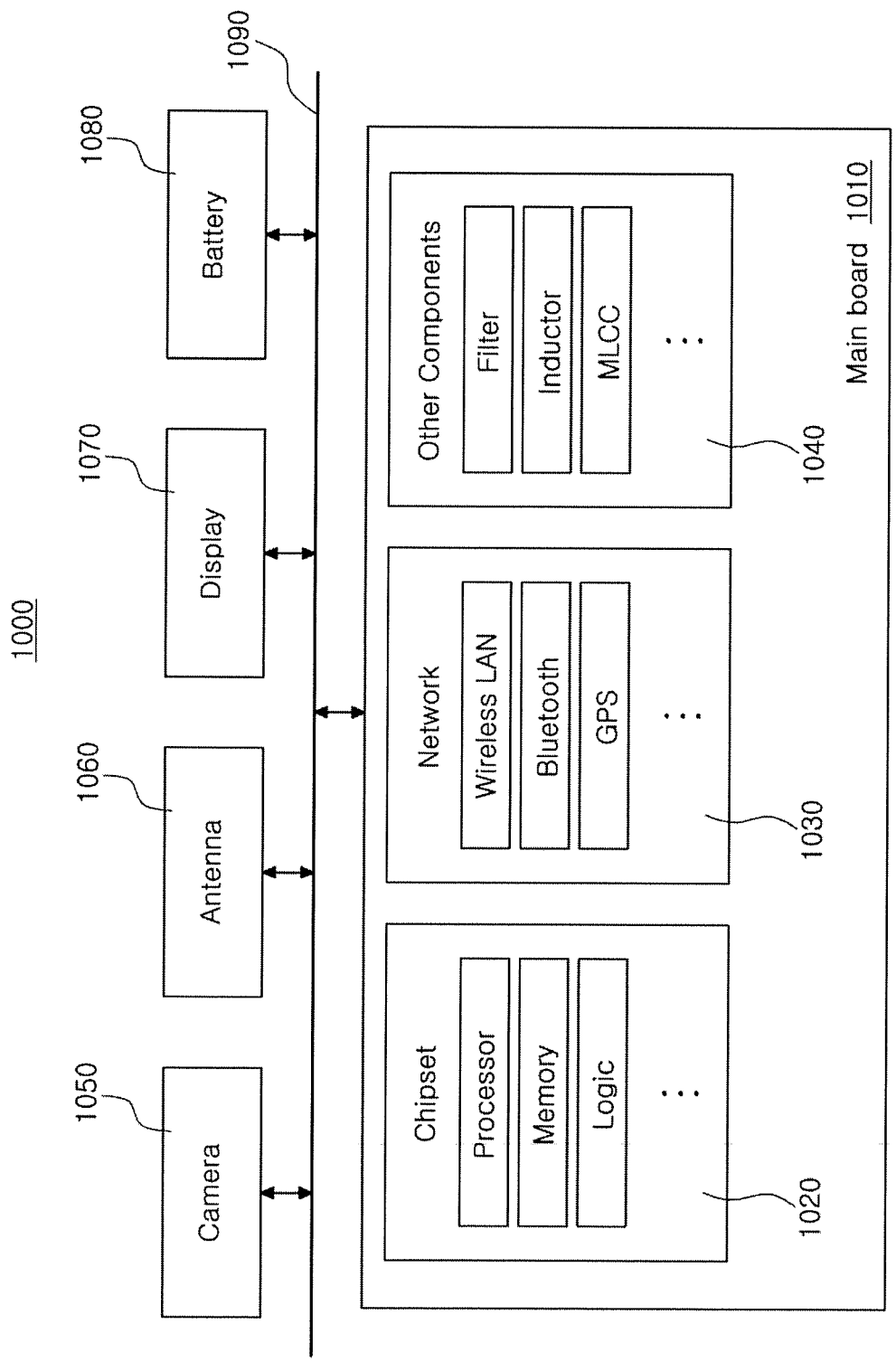
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
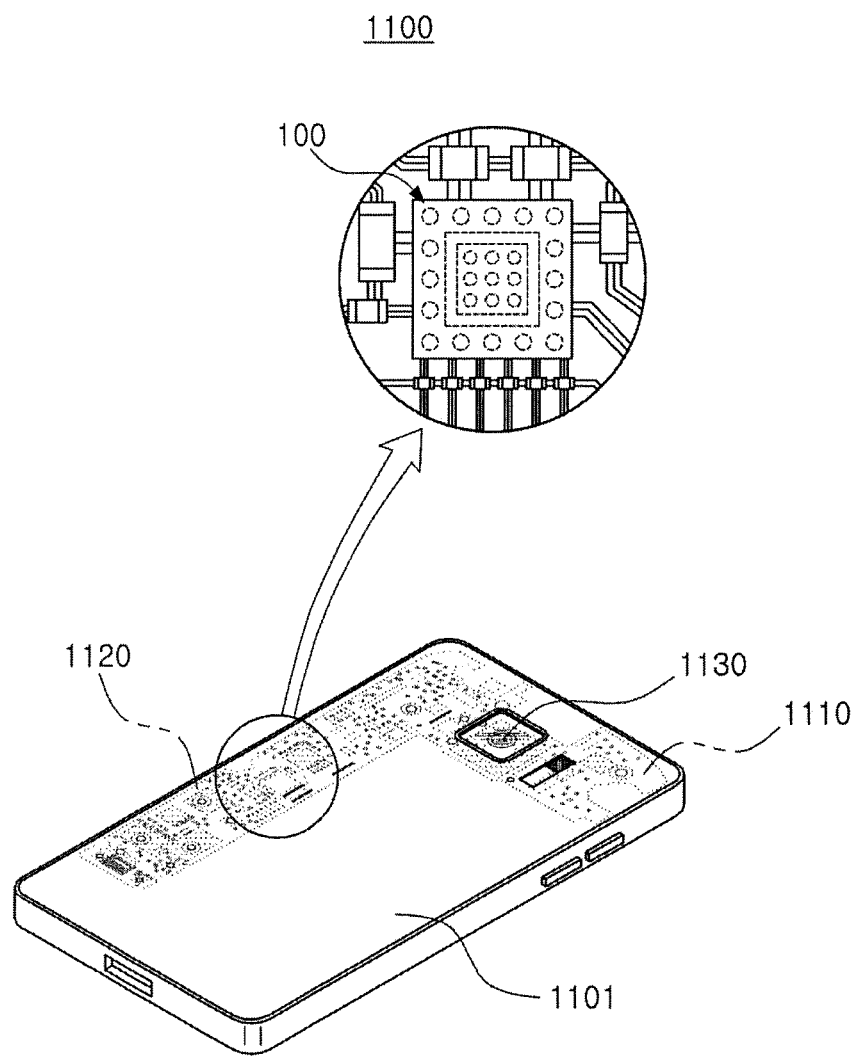
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 100, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
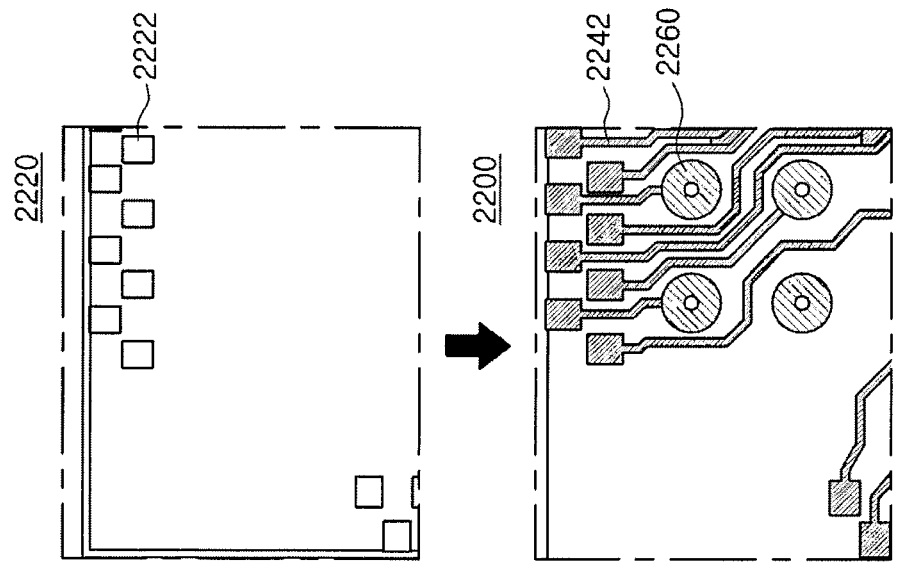
FIGS. 3A and 3B are schematic cross-sectional views illustrating states of a fan-in semiconductor package before and after being packaged.
Figure 3A:
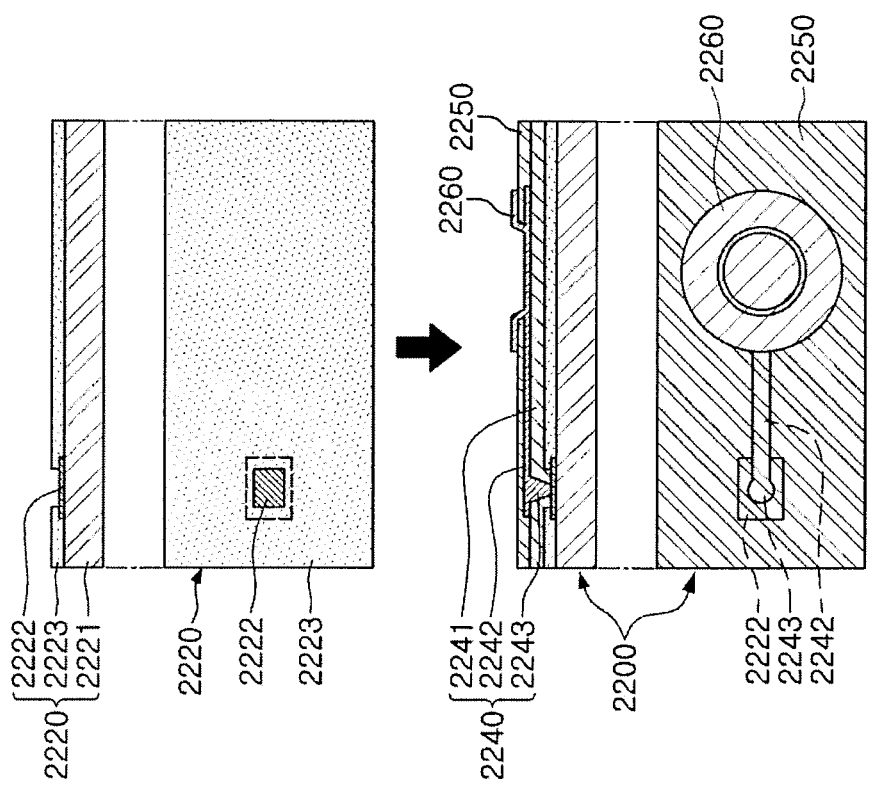

FIGS. 3A and 3B are schematic cross-sectional views illustrating states of a fan-in semiconductor package before and after being packaged.

Figure 4:
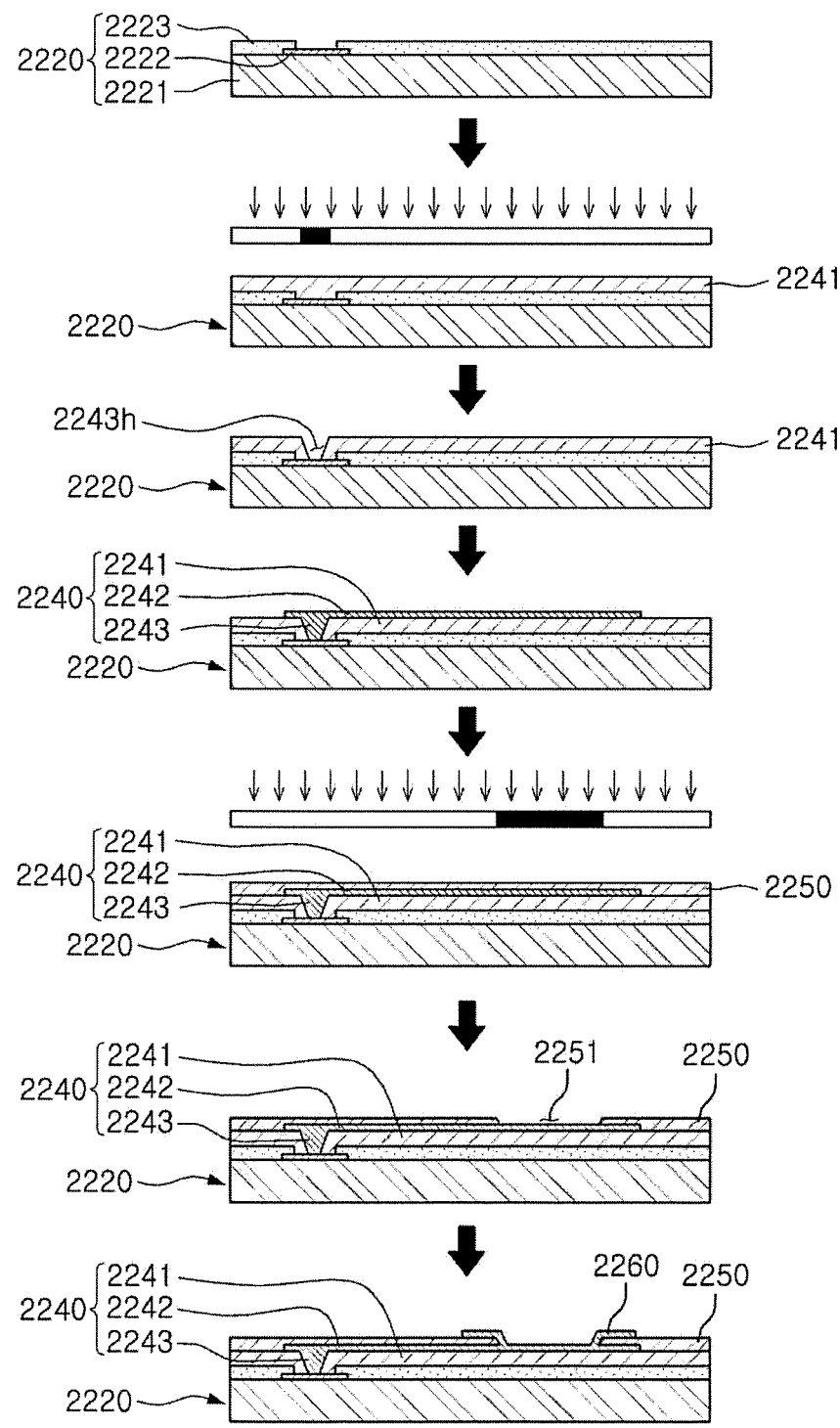
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
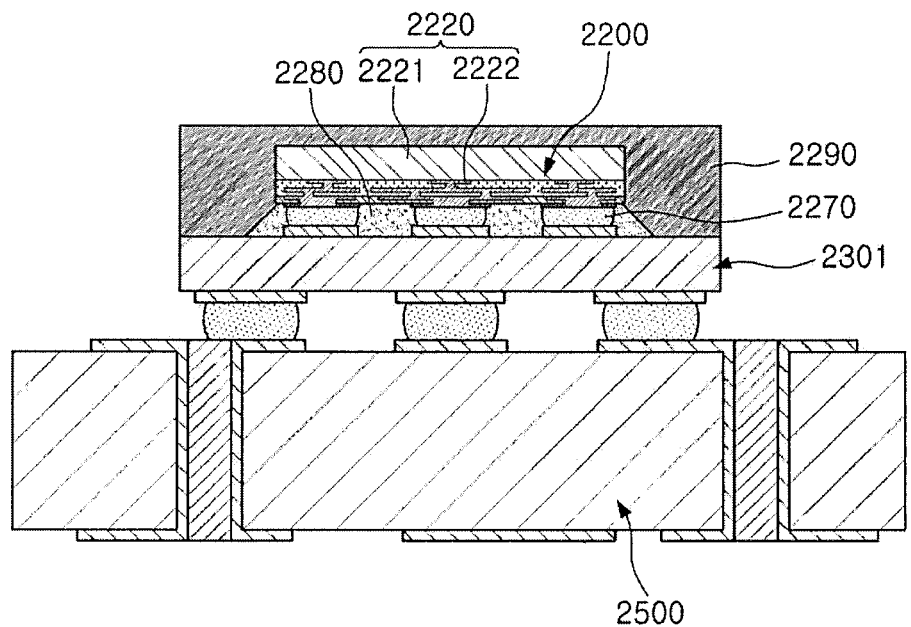
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
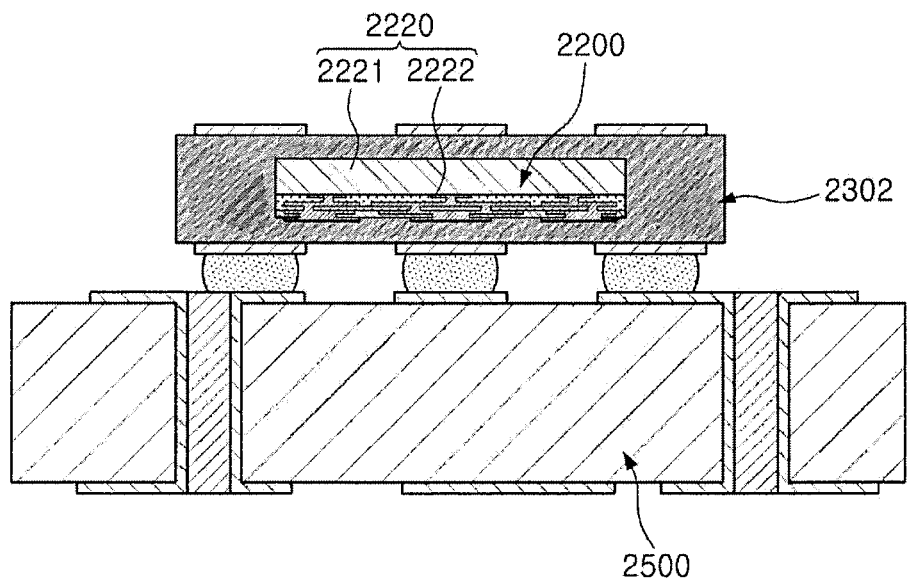
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
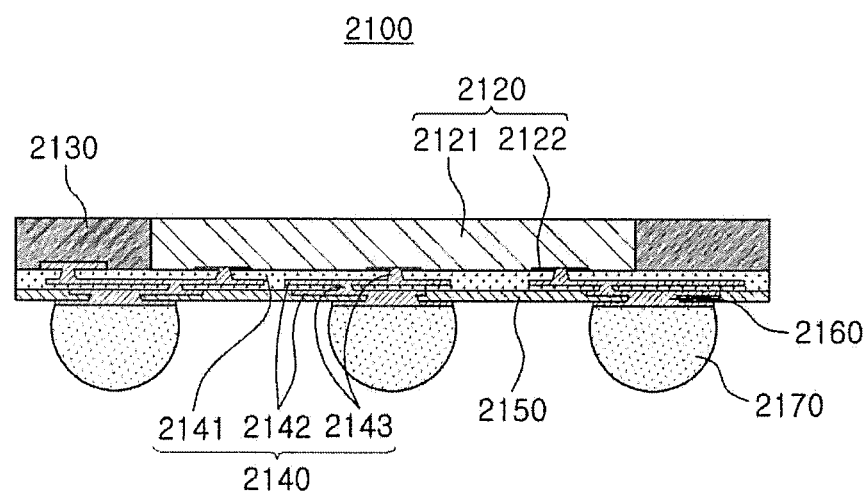
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
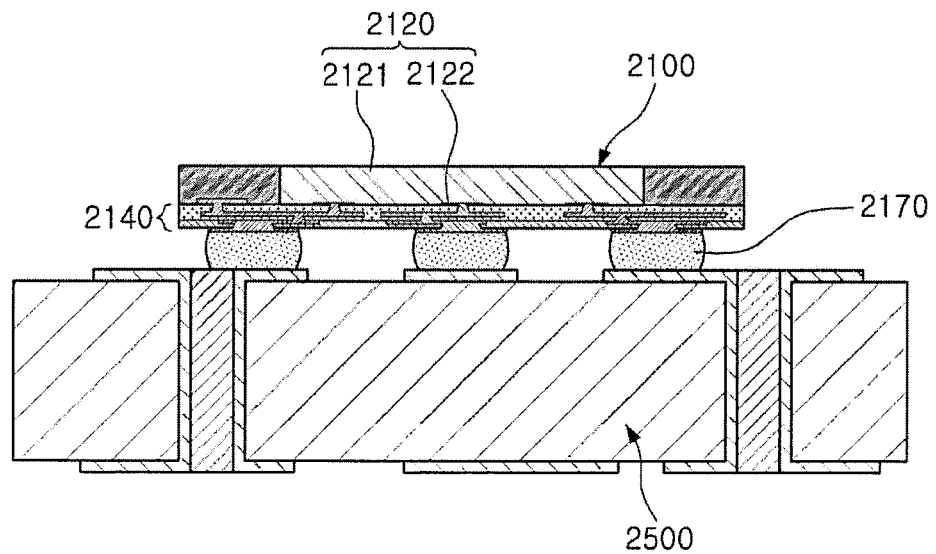
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
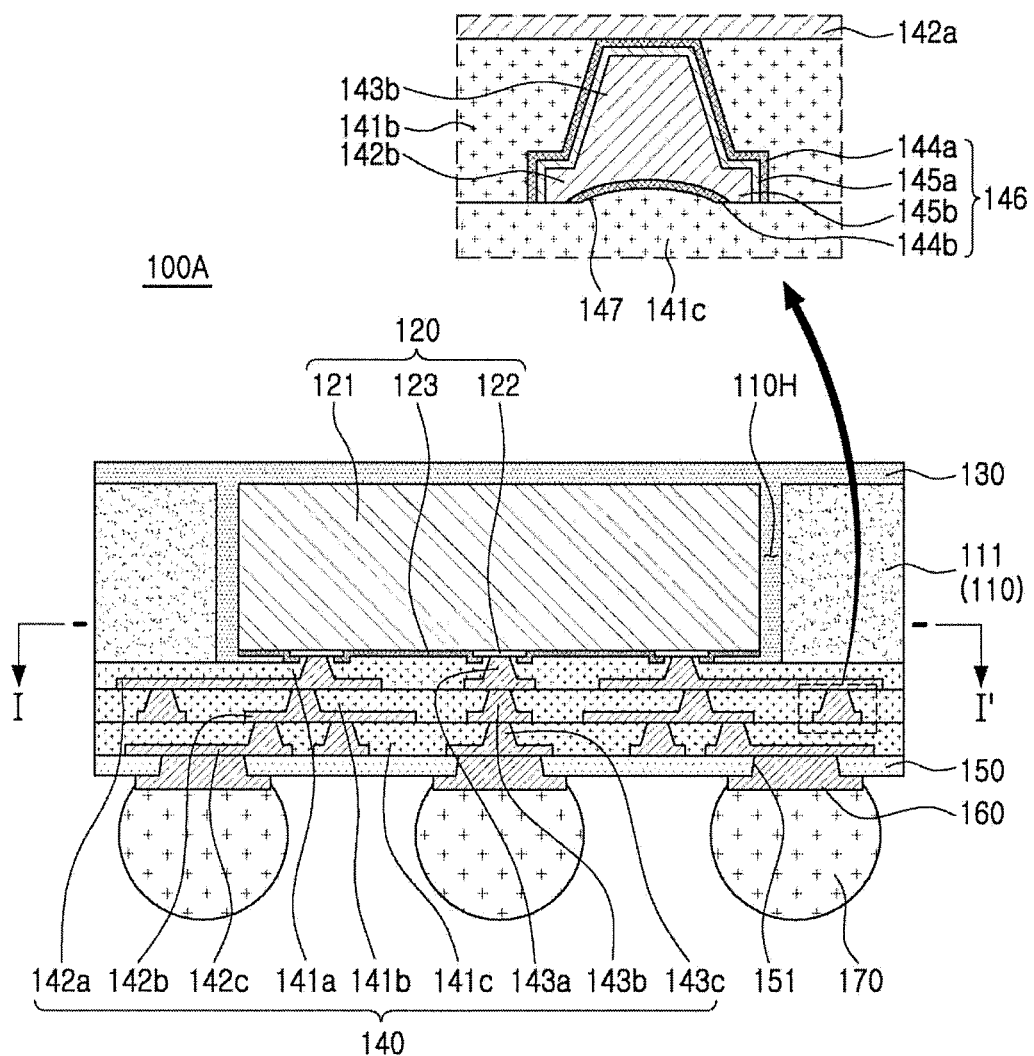
FIG. 9 is a schematic cross-sectional view illustrating an example of a fan-out semiconductor package.
Figure 10:
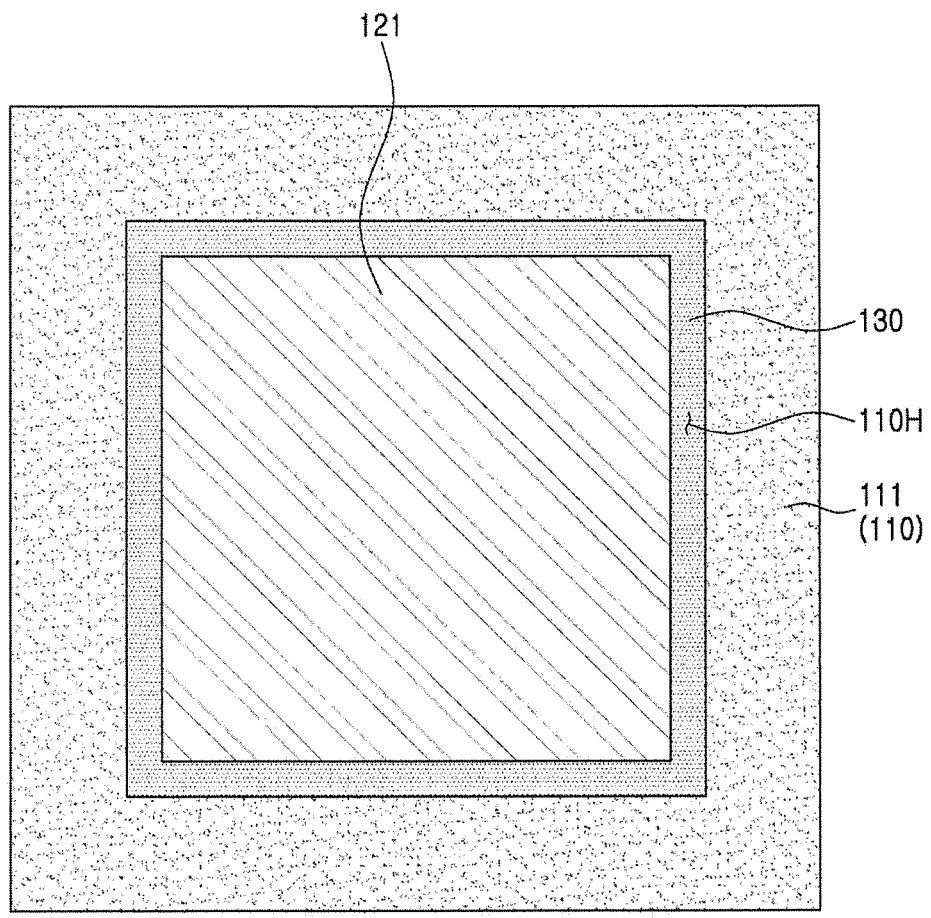
FIG. 10 is a cut-away plan view taken along line I-I' of the fan-out semiconductor package of FIG. 9.

FIG. 9 is a schematic cross-sectional view illustrating an example of a fan-out semiconductor package. FIG. 10 is a cut-away plan view of the fan-out semiconductor package of FIG. 9, taken along line I-I'.

Referring to FIGS. 9 and 10, a fan-out semiconductor package 100A according to an exemplary embodiment includes a core member 110 having a through-hole 110H, a semiconductor chip 120 positioned in the through-hole 110H of the core member 110 and having an active surface on which the connection pad 122 is disposed and an inactive surface disposed on the opposite side of the active surface, an encapsulant 130 encapsulating at least a portion of the core member 110 and the semiconductor chip 120, a connection member 140 disposed in the core member 110 and the active surface of the semiconductor chip 120, a passivation layer 150 disposed on a connection member 140, an underbump metal layer 160 disposed on an opening 151 of the passivation layer 150, and an electrical connection structure 170 disposed on the passivation layer 150 and connected to the underbump metal layer 160.

The connection member 140 includes a first insulating layer 141a disposed in the core member 110 and on the active surface of the semiconductor chip 120, a first redistribution layer 142a disposed on the first insulating layer 141a, a first via 143a connecting the first redistribution layer 142a and the connection pad 122 of the semiconductor chip 120, a second insulating layer 141b disposed on the first insulating layer 141a, a second redistribution layer 142b disposed on the second insulating layer 141b, a second via 143b penetrating through the second insulating layer 141b and connecting the first and second redistribution layers 142a and 142b, a third insulating layer 141c disposed on the second insulating layer 141b, a third redistribution layer 142c disposed on the third insulating layer 141c, and a third via 143c penetrating through the third insulating layer 141c and connecting the second and third redistribution layers 142b and 142c.

The redistribution layers 142a, 142b and 142c and the vias 143a, 143b and 143c are formed as a metal layer 146 like the second redistribution layer 142b and the second via 143b illustrated in an enlarged view. The metal layer 146 includes a first bonding metal layer 144a, a seed metal layer 145a, a plating metal layer 145b, and a second bonding metal layer 144b sequentially stacked on lower surfaces of the upper redistribution layers 142a, 142b, and 142c. The metal layer 146 may have a concave portion 147 having a dimple shape depressed from a lower surface thereof and the concave portion 147 is defined by a plating metal layer 145b and a second bonding metal layer 144b. That is, the plating metal layer 145b and the second bonding metal layer 144b have a shape concave to the inside, that is, the upper side of the metal layer 146 from the lower surface, and the second bonding metal layer 144b is exposed through the lower surface of the metal layer 146 and forms the concave portion 147. The concave portion 147 is filled with an insulating material, e.g., insulating layers 141a, 141b, and 141c covering the lower surface of the metal layer 146, and the insulating layers 141a, 141b, and 141c filling the concave portion 147 extend horizontally on the redistribution layers 142a, 142b, and 142c and the vias 143a, 143b, and 143c. However, in case where the metal layer is connected to the lower redistribution layers 142a, 142b, and 142c or the vias 143a, 143b, and 143c, the shape of the concave portion 147 may not be clearly recognized and the shape of the second bonding metal layer 144b in the connection region may be changed.

The structure of the metal layer 146 may be applied to each of at least some of the redistribution layers 142a, 142b and 142c or at least some of the vias 143a, 143b and 143c, or as illustrated, the structure of the metal layer 146 may be applied to the set of the redistribution layers 142a, 142b, and 142c and the vias 143a, 143b, and 143c formed together in the single insulating layers 141a, 141b, and 141c. In case where the structure of the metal layer 146 is applied to the redistribution layers 142a, 142b, and 142c, the concave portion 147 may have a cross-sectional shape such the enlarged region in a width direction of the redistribution layers 142a, 142b, and 142c, i.e., in the direction perpendicular to the extending direction.

The bonding metal layers 144a and 144b may be formed of a metal having excellent adhesion to the insulating layers 141a, 141b, and 141c and may include, for example, titanium (Ti) or an alloy thereof. Since the metal layer 146 includes the uppermost layer and the lower most layer in contact with the insulating layers 141a, 141b, and 141c, as bonding metal layers 144a and 144b, at the interface with the insulating layers 141a, 141b, and 141c, adhesion to the insulating layers 141a, 141b, and 141c may be enhanced. In the case of the metal layer 146 forming the third redistribution layer 142c, the second bonding metal layer 144b may be in contact with the lower passivation layer 150. Accordingly, delamination of the insulating layers 141a, 141b, and 141c and delamination of the passivation layer 150 in the connection member 140 may be prevented.

Hereinafter, each component included in the fan-out semiconductor package 100A according to the example will be described in more detail.

The core member 110 may further improve rigidity of the package 100A according to a specific material and may serve to ensure uniformity of the thickness of the encapsulant 130. In case where a penetrating line, or the like, is formed in the core member 110, the fan-out semiconductor package 100A may be utilized as a package-on-package (POP) type package. The core member 110 has a through-hole 110H. In the through-hole 110H, the semiconductor chip 120 is disposed to be spaced apart from the core member 110 by a predetermined distance. The side surface of the semiconductor chip 120 may be surrounded by the core member 110. However, this is merely an example and various modifications may be made in other forms and other functions may be performed according to the form thereof. The core member 110 may be omitted as necessary, but the presence of the core member 110 may be more advantageous in ensuring board level reliability intended in the present disclosure.

The core member 110 includes an insulating layer 111. As a material of the insulating layer 111, an insulating material may be used, and here, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto build-up film (ABF), FR-4, bismaleimide triazine (BT), or the like. The core member 110 may serve as a support member.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a microprocessor, a microcontroller, or the like. However, the IC is not limited thereto and may also be a logic chip such as an analog-to-digital converter (ADC), an application-specific IC (ASIC), and the like, or a memory chip such as a volatile memory (e.g., DRAM), a non-volatile memory (e.g., ROM and flash memory), and the like. Also, these may be combined to be disposed.

The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), copper (Cu), or the like. A passivation layer 123 exposing the connection pads 122 may be formed on the body 121, and may be an oxide layer, a nitride layer, or the like, or a double layer of an oxide layer and a nitride layer. A lower surface of the connection pad 122 may have a step with respect to a lower surface of the encapsulant 130 through the passivation layer 123, and a phenomenon that the encapsulant 130 bleeds into the lower surface of the connection pad 122 may be prevented to some degree. An insulating layer (not illustrated), and the like, may also be further disposed in other required positions. The semiconductor chip 120 may be a bare die, and if necessary, a redistribution layer (not shown) may further be formed on the active surface of the semiconductor chip 120, and a bump (not shown), or the like, may be connected to the connection pad 122.

The encapsulant 130 may protect the core member 110, the semiconductor chip 120, and the like. An encapsulation form of the encapsulant 130 is not particularly limited, but may be a form in which the encapsulant 130 surrounds at least portions of the core member 110, the semiconductor chip 120, and the like. For example, the encapsulant 130 may cover the inactive surface of the core member 110 and the semiconductor chip 120 and fill a space between a wall surface of the through-hole 110H and the side surface of the semiconductor chip 120. The encapsulant 130 may fill at least a portion of the space between the passivation layer 123 of the semiconductor chip 120 and the connection member 140. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used. As the insulating material, a thermosetting resin such as an epoxy resin, a thermoplastic resin such as polyimide, or a mixture of these resins with an inorganic filler, or a glass fiber such as a prepreg, an ABF, FR-4, BT, etc., may be used. If desired, a photo-insensitive dielectric (PID) resin may be used.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on functions. The connection member 140 may include a first insulating layers 141a disposed on the core member 110 and the active surface of the semiconductor chip 120, the redistribution layer 142a disposed on the first insulating layer 141a, the first via 143a connecting the first redistribution layer 142a and the connection pad 122 of the semiconductor chip 120, the second insulating layer 141b disposed on the first insulating layer 141a, the second redistribution layer 142b disposed on the second insulating layer 141b, the second via 143b penetrating through the second insulating layer 141b and connecting the first and second redistribution layers 142a, 142b, and 142c, the third insulating layer 141c disposed on the second insulating layer 141b, the third redistribution layer 142c disposed on the third insulating layer 141c, and the third via 143c penetrating through the third insulating layer 141c and connecting the second and third redistribution layer 142b and 142c. The first to third redistribution layers 142a, 142b, and 142c are electrically connected to the connection pad 122 of the semiconductor chip 120.

A material of each of the insulating layers 141a, 141b, and 141c may be an insulating material. In this case, a photosensitive insulating material such as a PID resin may also be used as the insulating material. That is, each of the insulating layers 141a, 141b, and 141c may be a photosensitive insulating layer. When the insulating layers 141a, 141b, and 141c have photosensitive properties, the insulating layers 141a, 141b, and 141c may be formed to have a smaller thickness, and a fine pitch of the vias 143a, 143b, and 143c may be achieved more easily. Each of the insulating layers 141a, 141b, and 141c may be a photosensitive insulating layer including an insulating resin and an inorganic filler. When the insulating layers 141a, 141b, and 141c are multiple layers, materials of the insulating layers 141 may be the same as each other, and may also be different from each other, if necessary. When the insulating layers 141a, 141b, and 141c are the multiple layers, the insulating layers 141 may be integrated with each other depending on a process, such that a boundary therebetween may also not be apparent. As illustrated, a larger number of insulating layers may be formed.

The redistribution layers 142a, 142b, and 142c may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. For example, the seed metal layer 145a and the plating metal layer 145b forming the redistribution layers 142a, 142b, and 142c may be formed of copper (Cu) or an alloy thereof and the bonding metal layers 144a and 144b may be formed of titanium (Ti) or an alloy thereof. However, the second bonding metal layer 144b is optional and may be omitted according to embodiments. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. Also, the redistribution layers 142a, 142b, and 142c may include a via pad pattern, an electrical connection structure pad pattern, and the like.

The vias 143a, 143b, and 143c may electrically connect the redistribution layers 142a, 142b, and 142c, the connection pads 122, and the like, formed on different layers to each other, resulting in an electrical path in the fan-out semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. For example, the seed metal layer 145a and the plating metal layer 145b forming the vias 143a, 143b, and 143c may be formed of copper (Cu) or an alloy thereof, and the bonding metal layers 144a and 144b may be formed of titanium (Ti) or an alloy thereof. Each of the vias 143a, 143b, and 143c may be completely filled with the conductive material or may have a concave portion 147, or the conductive material may also be formed along a wall of each of vias 143a, 143b, and 143c. Also, the vias 143a, 143b, and 143c may have any shape known in the art such as a tapered shape, a cylindrical shape, and the like.

The passivation layer 150 may protect the connection member 140 from external physical or chemical damage. The passivation layer 150 may have an opening 151 exposing at least a portion of the third redistribution layer 142 of the connection member 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metals 160 may improve connection reliability of the electrical connection structures 170 to improve board level reliability of the fan-out semiconductor package 100A. The underbump metals 160 may be connected to the third redistribution layer 142c of the connection member 140 exposed through the openings 151 of the passivation layer 150. The underbump metals 160 may be formed in the openings 151 of the passivation layer 150 by any known metallization method using any known conductive metal such as a metal, but is not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metals 160 extending onto one surface of the passivation layer 150, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated, a metal thin film may be performed on a wall surface of the through-hole 110H, if necessary, in order to shield electromagnetic waves. Also, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. Also, if necessary, a surface mount technology (SMT) component including a passive component, for example, an inductor, a capacitor, and the like, may be disposed on a surface of the passivation layer 150.

FIGS. 11A to 11D are schematic cross-sectional views illustrating an example of a process of forming the enlarged area of FIG. 9.

Referring to FIG. 11A, in a state in which the first insulating layer 141a, the first redistribution layer 142a, and the first via 143a are formed on the side where the connection pad 122 of the semiconductor chip 120 is formed, the second insulating layer 141b in which a region where the second redistribution layer 142b and the second via 143b are to be formed is patterned is formed. The second insulating layer 141b may be formed by a lamination method, a coating method, or the like, and may be patterned using a photolithography process.

Referring to FIG. 11B, the first bonding metal layer 144a and the seed metal layer 145a are sequentially formed in the patterned second insulating layer 141b. The first bonding metal layer 144a and the seed metal layer 145a may be formed by physical vapor deposition (PVD) such as sputtering or chemical vapor deposition (CVD), but the present disclosure is not limited thereto. The first bonding metal layer 144a and the seed metal layer 145a may be conformally formed along the inner wall of the patterned second insulating layer 141b.

Referring to FIG. 11C, the plating metal layer 145b and the second bonding metal layer 144b are sequentially formed on the first bonding metal layer 144a and the seed metal layer 145a in the patterned second insulating layer 141b. The plating metal layer 145b may be formed using a plating process such as electrolytic plating, or the like, but is not limited thereto. The plating metal layer 145b is formed at a second depth D2 smaller than a first depth D1 of the pattern in the second insulating layer 141b. For example, the second depth D2 may be formed in a range of 75% to 90% of the first depth D1, but is not limited thereto. Therefore, the plating metal layer 145b is formed to have a concave shape on a lower surface thereof, and the second bonding metal layer 144b is formed accordingly to form a concave portion 147 on a lower surface of the metal layer 146. The second bonding metal layer 144b may be formed by CVD or PVD, and may have a thickness of a few to tens of nanometers. According to the embodiments, the process of forming the second bonding metal layer 144b may be omitted, and in this case, the concave portion 147 is defined by the plating metal layer 145b.

Referring to FIG. 11D, the metal layer 146 is removed from the lower surface of the second insulating layer 141b to form the second redistribution layer 142b and the second via 143b. The removal process is performed by a buff polishing process. The buff polishing process is a polishing process using a polishing cloth, in which the first bonding metal layer 144a, the seed metal layer 145a, the plating metal layer 145b, and the second bonding metal layer 144b forming the metal layer 146 are physically removed from the lower surface of the second insulating layer 141b without a chemical abrasive. In the operation described above with reference to FIG. 11C, since the concave portion 147 is formed, the thickness of the plating metal layer 145b deposited on the lower surface of the second insulating layer 141b may be minimized, and accordingly, a portion of the metal layer 146 may be removed by a buff polishing process instead of the CMP. Therefore, it is possible to prevent problems such as damage to the metal layer 146 due to an alkali solution, contamination by an abrasive, and uneven polishing, which may be caused by the CMP process. During the buff polishing process, the second insulating layer 141b may be partially removed or may not be removed. The second bonding metal layer 144b may be exposed through the lower surface of the metal layer 146, and the first bonding metal layer 144a, the seed metal layer 145a, and the plating metal layer 145b may also be exposed in the circumference. However, according to the embodiment, the plating metal layer 145b may not be exposed through the lower surface of the metal layer 146.

Next, referring to FIG. 9, the third insulating layer 141c covering the second redistribution layer 142b is formed. The third insulating layer 141c may be formed by lamination or a coating method. The third insulating layer 141c is formed to fill the concave portion 147 of the metal layer 146 constituting the upper second redistribution layer 142b and extends.

Figure 12:
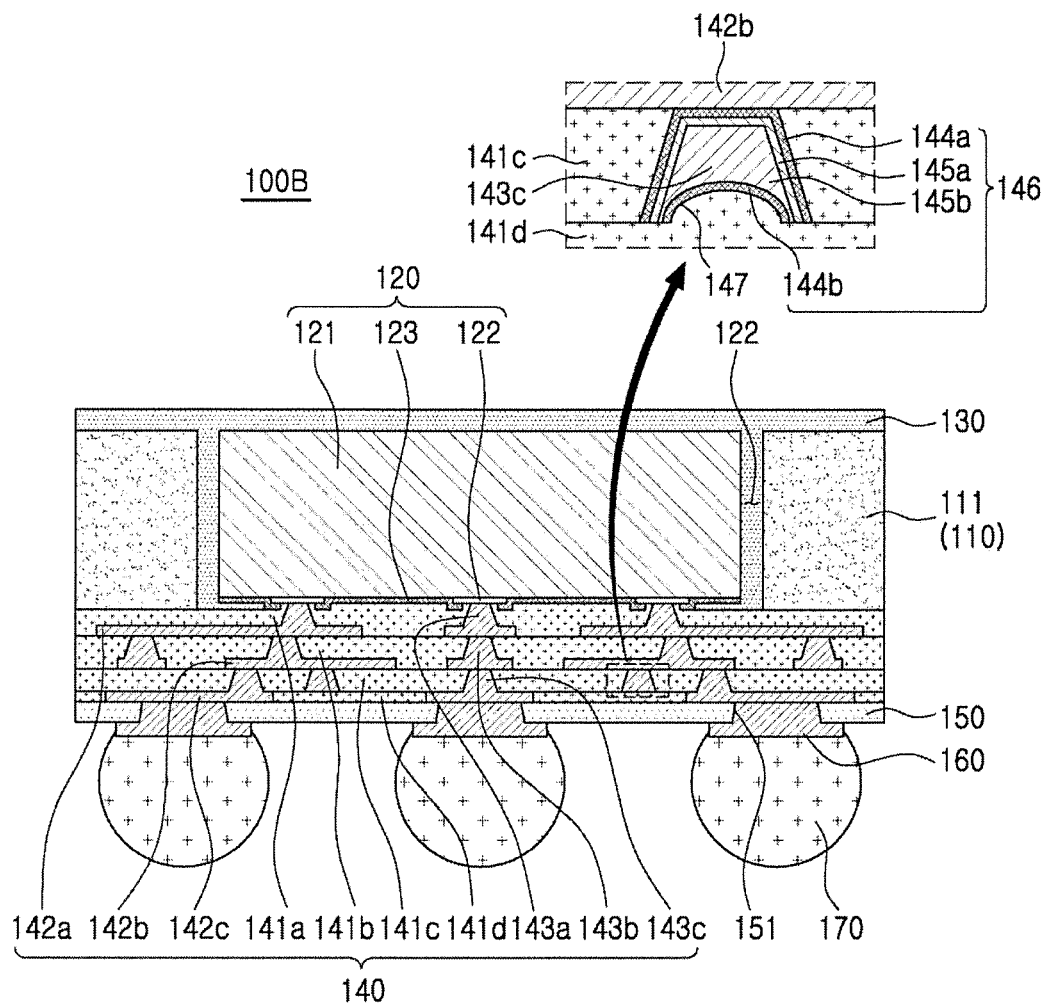
FIG. 12 is a schematic cross-sectional view illustrating another example of a fan-out semiconductor package.

FIG. 12 is a schematic cross-sectional view illustrating another example of a fan-out semiconductor package.

Referring to the drawings, a fan-out semiconductor package 100B according to another example includes the vias 143a, 143b, and 143c formed with concave portions 147 filled with the insulating layers 141a, 141b, 141c, and 141d. As illustrated in the enlarged view, the third via 143c is formed of the metal layer 146, and the concave portion 147 on the lower surface of the metal layer 146 is filled with the insulating layers 141a, 141b, and 141c covering the lower surface of the metal layer 146. However, when the metal layer 146 is connected to the lower redistribution layers 142a, 142b and 142c, the shape of the concave portion 147 may not be clearly recognized and the shape of the second bonding metal layer 144b in a connection region may be changed. The structure of the metal layer 146 forming the vias 143a, 143b, and 143c may be applied to at least a part of the vias 143a, 143b, and 143c. The redistribution layers 142a, 142b and 142c disposed on the vias 143a, 143b and 143c in this embodiment may also have the structure of the metal layer 146 in which the concave portion 147 is formed as described above with reference to FIG. 9, or the like, and details thereof are substantially the same as that of the fan-out semiconductor package 100A described above, and thus, a detailed description thereof will be omitted.

Figure 13:
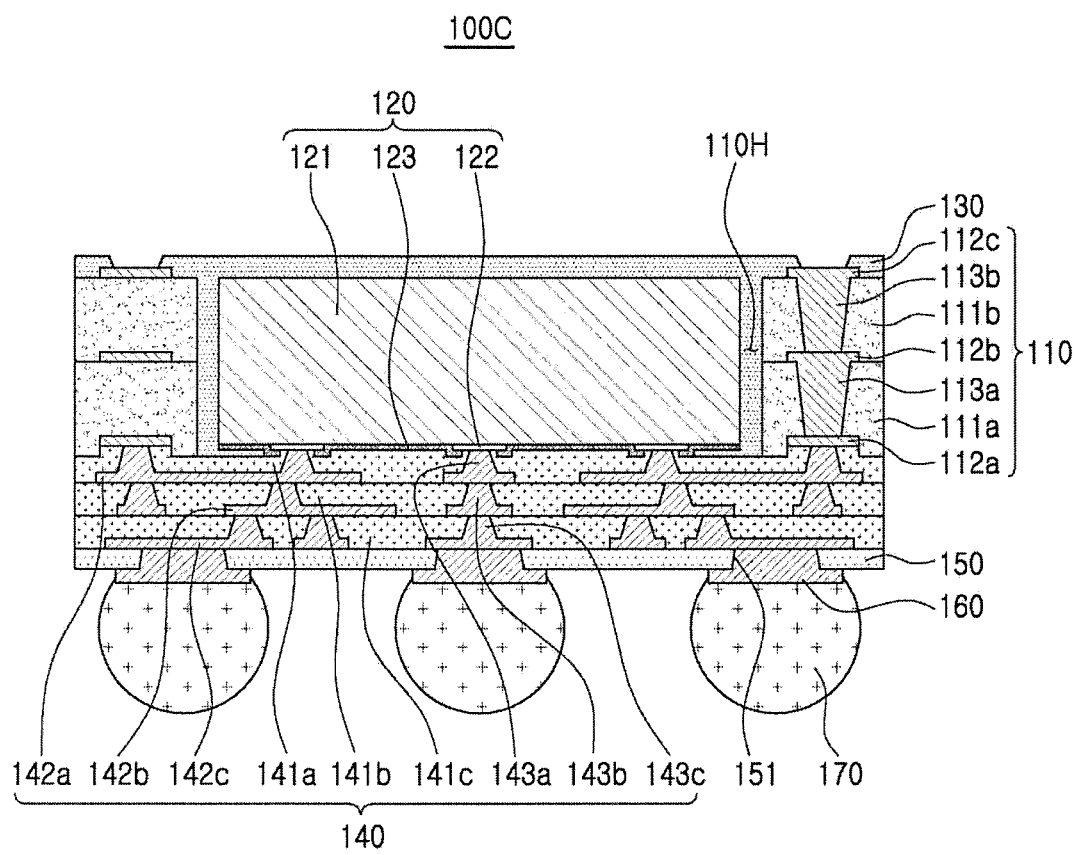
FIG. 13 is a schematic cross-sectional view illustrating another example of a fan-out semiconductor package.

FIG. 13 is a schematic cross-sectional view illustrating another example of a fan-out semiconductor package.

Referring to the drawings, in a fan-out semiconductor package 100C according to another example, the core member 110 may include a first insulating layer 111a in contact with the connection member 140, a first wiring layer 112a in contact with the connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c are electrically connected to the connection pad 122. The first and second wiring layers 112a and 112b and the second and third wiring layers 112b and 112c are electrically connected through the first and second vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the connection member 140 may thus become constant. That is, a difference between the distance from the first redistribution layer 142a of the connection member 140 to the lower surface of the first insulating layer 111a and the distance from the first redistribution layer 142a of the connection member 140 to the connection pad 122 of the semiconductor chip 120 may be smaller than the thickness of the first wiring layer 112a. Therefore, high-density wiring design of the connection member 140 may be facilitated.

A lower surface of the first wiring layer 112a of the core member 110 may be disposed on a level above a lower surface of the connection pad 122 of the semiconductor chip 120. Also, a thickness between the first redistribution layer 142a of the connection member 140 and the first wiring layer 112a of the core member 110 may be larger than the distance between the first redistribution layer 142a of the connection member 140 and the connection pad 122 of the semiconductor chip 120. This is because the first wiring layer 112a may be recessed to the inside of the first insulating layer 111a. In this manner, when the first wiring layer 112a is recessed to the inside of the first insulating layer 111a and the lower surface of the first insulating layer 111a and the lower surface of the first wiring layer 112a have a step, a phenomenon in which a material of an encapsulant 130 bleeds to pollute the first wiring layer 112a may be prevented. The second wiring layer 112b of the core member 110 may be positioned between the active surface and the inactive surface of the semiconductor chip 120. The core member 110 may have a thickness corresponding to the thickness of the semiconductor chip 120, and thus, the second wiring layer 112b formed inside the core member 110 may be disposed at a level between the active surface and the inactive surface of the semiconductor chip 120.

The thickness of the wiring layers 112a, 112b and 112c of the core member 110 may be thicker than the thickness of the redistribution layers 142a, 142b and 142c of the connection member 140. The core member 110 may have a thickness equal to or greater than that of the semiconductor chip 120 and the wiring layers 112a, 112b, and 112c may be formed to have a larger size in accordance with the scale. Meanwhile, the redistribution layers 142a, 142b, and 142c of the connection member 140 may be formed to have a size smaller than the wiring layers 112a, 112b, and 112c for thinning.

A material of each of the insulating layers 111a, 111b, and 111c is not particularly limited. For example, an insulating material may be used as the material of each of the insulating layers 111a, 111b, and 111c. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto build up film (ABF), FR-4, tismaleimide triazine (BT), or the like. Alternatively, a PID resin may also be used as the insulating material The wiring layers 112a, 112b, 112c, and 112d may serve to redistribute the connection pads 122 of the semiconductor chip 120. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like, Here, the signal (S) patterns may include various signals except for the ground (GND) patterns, the power (PWR) patterns, and the like, such as data signals, and the like. In addition, the wiring layers 112a, 112b, 112c, and 112d may include via pads, wire pads, electrical connection structure pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113 may be completely filled with the conductive material, or the conductive material may also be formed along a wall of each of via holes. Further, any known shape such as a cylindrical shape, or the like, as well as a tapered shape, may be applied. Some of the pads of the first wiring layer 112a may serve as a stopper when the hole for the first via 113a is formed. It may be advantageous in terms of process that the width of an upper surface of the first via 113a is greater than the width of a lower surface, forming a tapered shape. In this case, the first vias 113a may be integrated with the pad pattern of the second wiring layer 112b. In addition, when forming the holes for the second vias 113b, some of the pads of the second wiring layer 112b may serve as stoppers, and it may be advantageous in terms of process that the width of an upper surface of the second via 113b is greater than the width of a lower surface, forming a tapered shape. In this case, the second via 113b may be integrated with the pad pattern of the third wiring layer 112c.

Other components, for example, the contents of the metal layer 146 of the connection member 140 described with reference to FIG. 9, and the like, may also be applied to the fan-out semiconductor package 100C according to another example, and details thereof are substantially the same as that of the fan-out semiconductor package 100A described above, and thus, a detailed description thereof will be omitted.

Figure 14:
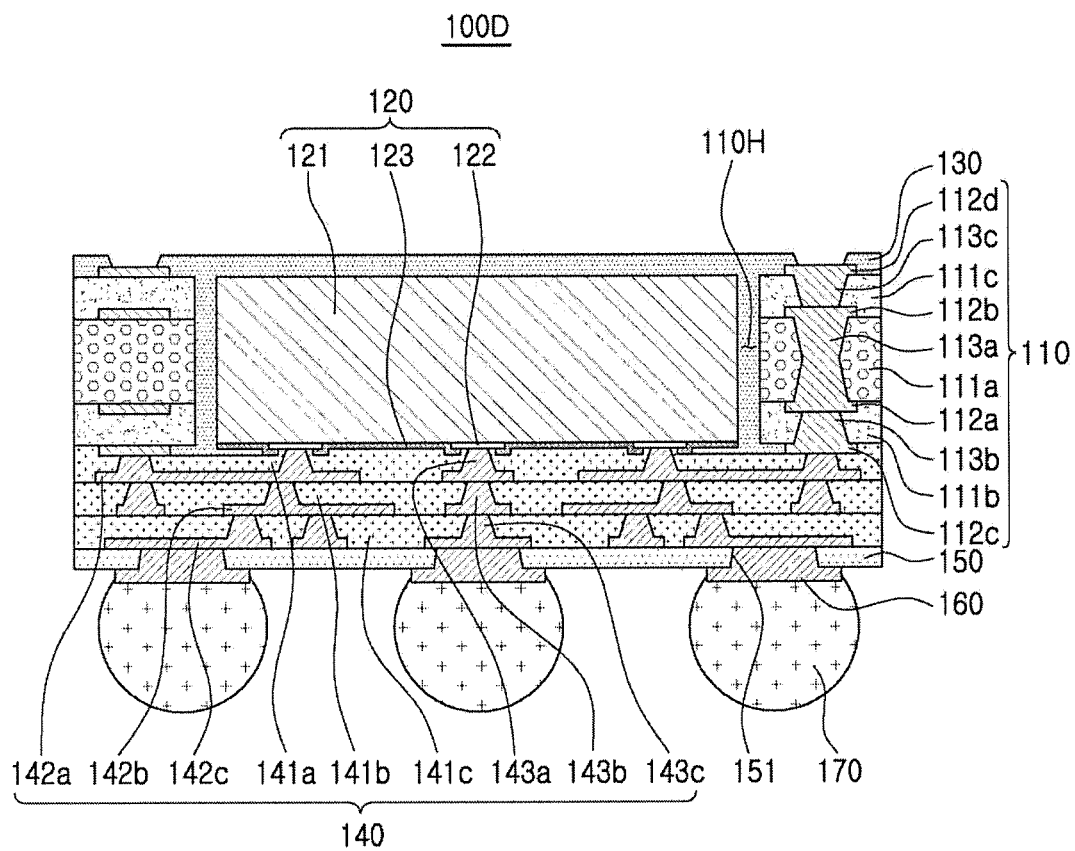
FIG. 14 is a schematic cross-sectional view illustrating another example of a fan-out semiconductor package.

FIG. 14 is a schematic cross-sectional view illustrating another example of a fan-out semiconductor package.

Referring to the drawings, in a fan-out semiconductor package 100D according to another example, the core member 110 includes the first insulating layer 111a, the first wiring layer 112a and the second wiring layer 112b disposed on both surfaces of the first insulating layer 111a, the second insulating layer 111b disposed on the first insulating layer 111a and covering the first wiring layer 112a, the third wiring layer 112c disposed on the second insulating layer 111b, the third insulating layer 111c disposed on the first insulating layer 111a and covering the second wiring layer 112b, and the fourth wiring layer 112d disposed on the third insulating layer 111c. The first to fourth wiring layers 112a, 112b, 112c, and 112d may be electrically connected to connection pads 122. Since the core member 110 may include a larger number of wiring layers 112a, 112b, 112c, and 112d, a connection member 140 may be more simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a glass fiber, an inorganic filler, and an insulating resin, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first via 113a penetrating through the first insulating layer 111a may have a diameter greater than those of the second and third vias 113b and 113c each penetrating through the second and third insulating layers 111b and 111c.

A lower surface of the third wiring layer 112c of the core member 110 may be disposed on a level below a lower surface of the connection pad 122 of a semiconductor chip 120. In addition, a distance between the first redistribution layer 142a of the connection member 140 and the third wiring layer 112c of the core member 110 may be smaller than that between the first redistribution layer 142 of the connection member 140 and the connection pad 122 of the semiconductor chip 120. The reason is that the third wiring layer 112c may be disposed on the second insulating layer 111b in a protruding form, resulting in being in contact with the connection member 140. The first wiring layer 112a and the second wiring layer 112b of the core member 110 may be disposed on a level between an active surface and an inactive surface of the semiconductor chip 120. The core member 110 may be formed to correspond to the thickness of the semiconductor chip 120, and thus, the first wiring layer 112a and the second wiring layer 112b formed inside the core member 110 may be disposed at a level between the active surface and the inactive surface of the semiconductor chip 120.

The thickness of the wiring layers 112a, 112b, 112c and 112d of the core member 110 may be larger than the thickness of the redistribution layers 142a, 142b and 142c of the connection member 140. The core member 110 may have a thickness equal to or greater than that of the semiconductor chip 120 and the wiring layers 112a, 112b, 112c and 112d may also be formed in a larger size. Meanwhile, the redistribution layers 142a, 142b, 142c of the connection member 140 may be formed in a relatively small size for thinning.

Other components, for example, the contents of the metal layer 146 of the connection member 140 described above with reference to FIG. 9, and the like, may also be applied to the fan-out semiconductor package 100C according to another example, and details thereof are substantially the same as that of the fan-out semiconductor package 100A described above, and thus, a detailed description thereof will be omitted.

As set forth above, according to exemplary embodiments of the present disclosure, the semiconductor package in which adhesion between the wiring layers and the insulating layers is ensured in the connection members for redistributing the connection pads of the semiconductor chip may be provided.

While exemplary embodiments have been illustrated and described above, it will be apparent to those skilled in the art that modifications and variations could be made without departing from the scope of the present invention as defined by the appended claims.

What is claimed is:

1. A semiconductor package comprising:
 a semiconductor chip having an active surface having connection pads disposed thereon and an inactive surface opposing the active surface;
 an encapsulant encapsulating at least a portion of the semiconductor chip; and
 a connection member disposed on the active surface of the semiconductor chip and including an insulating layer, a redistribution layer and a via, the redistribution layer and the via being electrically connected to the connection pads of the semiconductor chip,
 wherein at least a portion of the redistribution layer and the via is formed of a metal layer having a concave portion depressed from a lower surface thereof, the concave portion being filled with an insulating material,
 the metal layer includes a plating metal layer and a bonding metal layer disposed on a surface of the plating metal layer and exposed through the concave portion, and the bonding metal layer is in contact with the insulating layer stacked on the lower surface of the metal layer on which the concave portion is formed.

2. The semiconductor package of claim 1, wherein the bonding metal layer disposed along an interface with the insulating layer.

3. The semiconductor package of claim 1, wherein the metal layer includes an inner bonding metal layer, a seed metal layer, the plating metal layer, and the bonding metal layer which are sequentially stacked.

4. The semiconductor package of claim 3, wherein the inner bonding metal layer and the bonding metal layer include titanium (Ti).

5. The semiconductor package of claim 3, wherein the seed metal layer and the plating metal layer include copper (Cu).

6. The semiconductor package of claim 3, wherein the inner bonding metal layer is in contact with the insulating layer.

7. The semiconductor package of claim 1, wherein the insulating material fills the concave portion and horizontally extends on the redistribution layer and the via.

8. The semiconductor package of claim 1, further comprising:
 a core member having a through-hole,
 wherein the semiconductor chip is disposed in the through-hole of the core member.

9. The semiconductor package of claim 8, wherein the core member includes a first core insulating layer, a first wiring layer in contact with the connection member and embedded in one side of the first core insulating layer, and a second wiring layer disposed on another side opposite to the one side of the first core insulating layer where the first wiring layer is embedded, and
 the first and second wiring layers are electrically connected to the connection pads.

10. The semiconductor package of claim 9, wherein the core member further includes:
 a second core insulating layer disposed on the first core insulating layer and covering the second wiring layer and a third wiring layer disposed on the second core insulating layer at an opposite side of the second wiring layer.

11. The semiconductor package of claim 8, wherein the core member includes: a first core insulating layer and a first wiring layer and a second wiring layer disposed on both surfaces of the first core insulating layer, and
 the first and second wiring layers are electrically connected to the connection pads.

12. The semiconductor package of claim 11, wherein the core member further includes a second core insulating layer, disposed on a lower surface of the first core insulating layer and covering the first wiring layer, and a third wiring layer disposed on the second core insulating layer at an opposite side of the first wiring layer, and
 the third wiring layer is electrically connected to the connection pads.

13. The semiconductor package of claim 12, wherein the core member further includes a third core insulating layer, disposed on an upper surface of the first core insulating layer and covering the second wiring layer, and a fourth wiring layer disposed on the third core insulating layer at an opposite side of the second wiring layer, and
 the fourth wiring layer is electrically connected to the connection pads.

14. A semiconductor package comprising:
a semiconductor chip having an active surface having connection pads disposed thereon and an inactive surface opposing the active surface;
an encapsulant encapsulating at least a portion of the semiconductor chip; and
a connection member disposed on the active surface of the semiconductor chip and including a redistribution layer, a via electrically connected to the connection pads of the semiconductor chip, and an insulating layer,
wherein at least a portion of the redistribution layer or the via has a concave portion depressed from a lower surface thereof in contact with an insulting layer and is formed of a metal layer having a first bonding metal layer, a seed metal layer, a plating metal layer, and a second bonding metal layer which are sequentially stacked, and
the second bonding metal layer is exposed through the concave portion and in contact with the insulating layer.

15. The semiconductor package of claim 14, wherein the first and second bonding metal layers include titanium (Ti).

* * * * *